United States Patent

[11] 3,587,001

[72] Inventor Norman J. Parchim
Des Plaines, Ill.
[21] Appl. No. 7,386
[22] Filed Feb. 2, 1970
[45] Patented June 22, 1971
[73] Assignee Teletype Corporation
Skokie, Ill.
Continuation of application Ser. No. 716,494, Mar. 27, 1968, now abandoned.

[54] START-STOP OSCILLATOR CONTROL CIRCUIT

10 Claims, 1 Drawing Fig.

[52] U.S. Cl. .... 331/111, 307/236, 331/113, 331/145, 331/172
[51] Int. Cl. .... H03k 3/08
[50] Field of Search .... 331/113, 111, 145, 172; 307/236

[56] References Cited
UNITED STATES PATENTS
3,320,434 5/1967 Ott .... 307/236

*Primary Examiner*—John Kominski
*Attorneys*—J. L. Landis and R. P. Miller

ABSTRACT: A single control transistor is utilized to control the starting and stopping of an operational amplifier astable multivibrator having a timing capacitor which is charged between positive and negative voltages by the output of the amplifier. The transistor is connected between the capacitor and the output of the amplifier and normally is nonconductive. Upon application of a forward bias potential to the base of the transistor, the capacitor rapidly charges to the amplifier output voltage, provided the collector-emitter junction of the transistor is forward-biased at the time the bias potential is applied. If the collector of the transistor is reverse-biased by the capacitor charge and the amplifier output voltage at the time the bias potential is applied to the base of the transistor, the capacitor is charged through the base-collector junction of the transistor to a value sufficient to cause the multivibrator to switch states, after which the capacitor discharges toward the amplifier output voltage through the collector of the transistor in the normal manner.

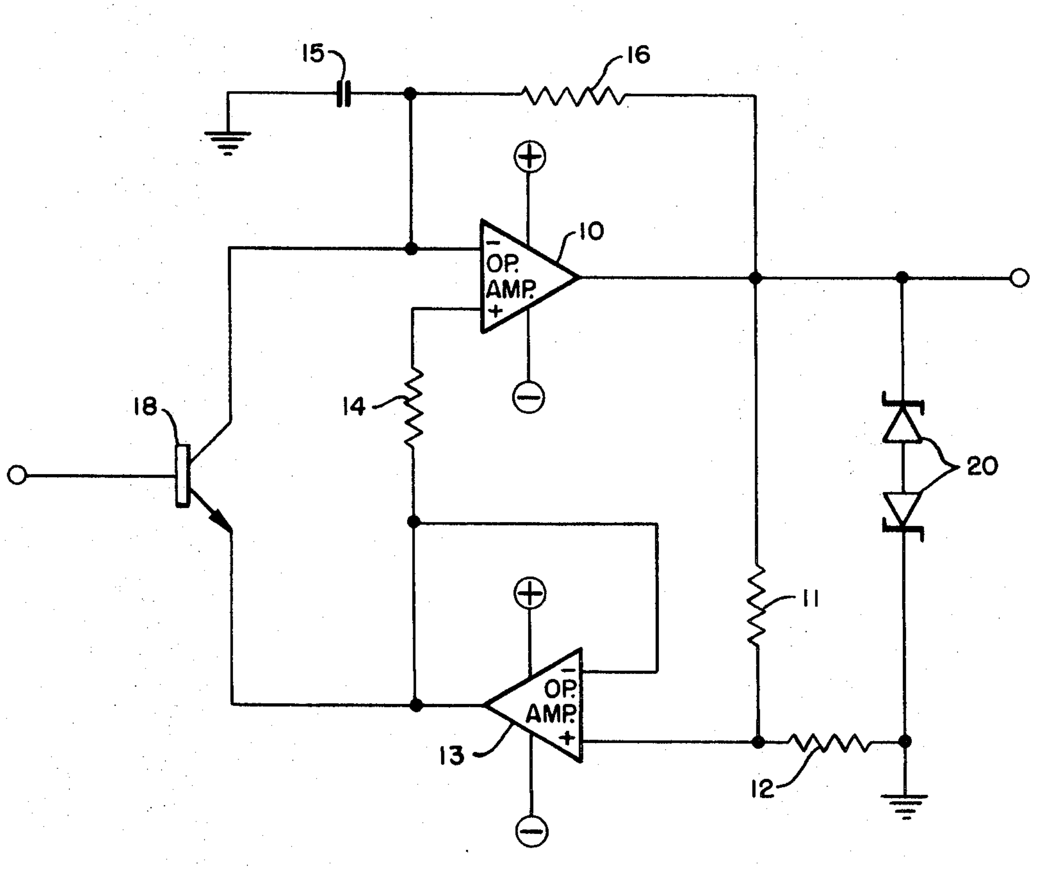
INVENTOR
NORMAN J. PARCHIM
BY La Valle Stark
ATTORNEY

START-STOP OSCILLATOR CONTROL CIRCUIT

This is a continuation of application Ser. No. 716,494, filed on Mar. 27, 1968 (now abandoned).

BACKGROUND OF THE INVENTION

In data communications systems it often is desirable to provide a means for controlling the operation of a clock pulse generator by causing it to start and to stop in accordance with the application of external control signals. Generally, such clock pulse generators are in the from of astable multivibrators and a problem arises in that the multivibrator may be turned off in either of its output states; so that upon restarting of the multivibrator, the phase and polarity of the first output pulse are not necessarily the same each time the multivibrator is restarted.

SUMMARY OF THE INVENTION

In accordance with a preferred embodiment of this invention, an operational amplifier, astable multivibrator has a timing capacitor which is charged between positive and negative voltages by the output of the amplifier. A control means is provided for causing the timing capacitor to charge immediately to a first value if a first predetermined relationship between the output of the amplifier and the charge on the capacitor exists and to cause the capacitor to be charged to a different value if a second predetermined relationship exists between the charge on the capacitor and the output of the amplifier at the time the control means is operated.

BRIEF DESCRIPTION OF THE DRAWING

The single FIGURE of the drawing shows a circuit diagram of a preferred embodiment of the invention.

DETAILED DESCRIPTION

Referring now to the drawing, there is shown an astable multivibrator comprising a standard operational amplifier 10 which is operated in either of two metastable states, in one of which the output of amplifier 10 is at positive saturation and in the other of which the output of the amplifier 10 is at negative saturation. A signal representative of the output to the amplifier 10 is obtained across a voltage divider consisting of a pair of resistors 11 and 12; and this signal is supplied through a second operational amplifier 13, connected as a voltage-follower, to the noninverting (positive) input of the operational amplifier 10 through a feedback resistor 14. At the same time, a capacitor 15, connected between ground and the inverting (negative) input of the oscillator 10, is charged through a charging resistor 16 from the output of the amplifier 10.

Assume that the operational amplifier 10 saturates symmetrically between a predetermined positive potential and a predetermined negative potential with respect to ground; and further assume that the amplifier 10 has been in the positive output state for a sufficient time to allow a capacitor 15 to be charged to a potential such that the potential applied to the negative input terminal of the amplifier 10 has just approached the potential applied to the positive input terminal of the amplifier 10 from the output of the amplifier 13. When the charge on the capacitor 15 equals the potential applied to the positive input of the amplifier 10, the amplifier 10 switches from its positive output state to its negative output state, causing a negative potential to be applied instantaneously through the voltage-follower amplifier 13 to the positive input of the amplifier 10. At the same time the capacitor 15 commences charging toward a negative potential through the resistor 16 at a rate determined by the value of the resistor 16. Once again when the charge on the capacitor 15 equals the potential applied to the positive input of the amplifier 10 from the voltage-follower amplifier 13, the amplifier 10 switches back to its positive output state. This cycle of operation continues to be repeated with the operational amplifier 10 functioning as a free-running astable multivibrator, the frequency of which depends upon the proportion of the output voltage applied by the voltage amplifier 13 to the positive input of the amplifier 10 and upon the values of the resistor 16 and the capacitor 15.

In order to utilize an astable multivibrator of this type as a clock circuit, it generally is desirable to be able to control the turning on and turning off of the multivibrator in such a manner that the first output pulse always occurs the same predetermined time interval after the turn on command signal is supplied to the circuit and to cause the first output pulse always to be of the same polarity. This is accomplished in the circuit shown in the drawing by connecting the collector of an NPN control transistor 18 to the junction between the capacitor 15 and the negative input of the operational amplifier 10 and by connecting the emitter of the transistor 18 to the output of the voltage-follower operational amplifier 13. During the free-running operation of this circuit, the transistor 18 normally has a negative bias potential applied to the base so that it is nonconductive, causing the multivibrator circuit to operate as if the transistor 18 were not present.

When the multivibrator is to be turned off, a positive potential is applied to the base of the transistor 18. If at this time the output of the operational amplifier 10 is a negative potential, a negative potential appears at the output of the voltage-follower operational amplifier 13 and is applied to the emitter of the transistor 18. At the same time the potential applied to the emitter of the transistor 18 by the capacitor 15 is at some value which is more positive than the negative potential applied to the emitter of the transistor 18, causing the transistor to be forward-biased in the normal manner. Thus, the transistor 18 conducts, causing substantially a short circuit to appear across the capacitor 15 to rapidly charge the capacitor 15 to the negative potential appearing at the output of voltage-follower 13; and so long as the transistor 18 is biased into conduction by the application of a positive potential on its base, the operational amplifier 10 is clamped to provide a negative output. When the transistor 18 once again is biased to nonconduction by the application of a negative potential on its base, the free-running operation is allowed to resume.

If the amplifier 10 has a positive output at the time that the positive biasing potential is applied to the base of the transistor 18, a positive reference potential is present at the output of the voltage-follower amplifier 13 and is applied to the emitter of the transistor 18. The magnitude of this positive potential, however, is somewhat less than the magnitude of the positive biasing potential applied to the base of the transistor 18, so that the base-emitter junction of the transistor 18 is forward-biased. At the same time, the potential applied to the collector of the transistor 18 by the capacitor 15 is either negative, ground or a positive potential having a magnitude less than the magnitude of the positive potential applied to the emitter of the transistor 18. Thus, the collector of the transistor 18 is reversed-biased at this time and no current can flow through it from the collector to the emitter.

The base of the transistor 18, however, is biased to a more positive potential than either the potential appearing on the collector of the transistor 18 or appearing on the emitter thereof. Due to the diode action of the base collector junction when the transistor 18 is biased in this manner, current flows from the base through the collector of the transistor 18 to rapidly charge the capacitor 15 toward the value of the bias potential applied to the base of the transistor 18, causing a rapid rise in the potential appearing at the negative input of the operational amplifier 10 which soon equals the positive potential applied to the positive input thereof by the voltage-follower amplifier 13. This causes the operational amplifier 10 to switch to its negative output, immediately causing a negative potential to be applied to the emitter of the transistor 18 by the voltage-follower amplifier 13.

The collector-emitter path of the transistor 18 then is forward-biased, with the emitter being at a relatively negative potential compared to the potential appearing on its collector. As a result, current is allowed to flow through the collector of the transistor, so that the capacitor 15 rapidly charges to the negative potential appearing at the output of the voltage-follower 13. The multivibrator then is clamped in its negative output state in the same manner as when the transistor 18 is rendered conductive at a time that the operational amplifier 10 is in its negative state. This results in causing the capacitor 15 and the output of the voltage-follower 13 to be clamped to the same negative potential almost instantaneously when the transistor 18 is forward-biased by the application of a positive biasing potential to its base, irrespective of the particular state of the operational amplifier 10 and the charge on the capacitor 15 just prior to the time of application of this biasing potential. As a consequence when the transistor 18 subsequently is rendered nonconductive to initiate operation of the multivibrator, the first output pulse or signal transition always is of the same polarity and always occurs at the same time interval following the turning off of the transistor 18.

The voltage-follower amplifier 13 is provided in order to handle the current caused by turnoff of the multivibrator; but in the free-running operation of the circuit, the voltage-follower 13 merely serves to couple the output of the operational amplifier 10 to its positive input. A pair of back-to-back connected Zener diodes 20 are placed in series between ground and the output of the operational amplifier 10, so that the differential input voltage to the operational amplifier 10 does not exceed a predetermined maximum amount. The use of the diodes 10 also serves to insure that the output of the multivibrator is a square wave since the diodes clip the output of the operational amplifier 10 below the amplitude at which overshoot, ringing or rounding of the signals can occur.

Although the invention has been described in conjunction with a particular embodiment, it is to be understood that the invention is not limited to that embodiment only since other modifications of the control circuit, varied to fit particular operating conditions, will be apparent to those skilled in the art; and the invention covers all changes and modifications which do not constitute departures from the true scope of the invention.

What I claim is:

1. A circuit for exercising a control function in response to receipt of an input signal including:

means for storing a potential which can be varied;

means for providing a reference potential of at least one magnitude, the reference potential and stored potential being related so that the reference potential is sometimes positive and sometimes negative with respect to the stored potential;

means responsive to a difference between the reference potential and the stored potential for varying the stored potential at a predetermined rate; and means responsive to receipt of the input signal for changing the stored potential at a rate significantly more rapid than the predetermined rate to a first predetermined value whenever the reference potential is positive relative to the stored potential at the time the input signal is received and for changing the stored potential at a rate significantly more rapid than the predetermined rate to a second predetermined value whenever the reference potential is negative relative to the store potential at the time the input signal is received.

2. A circuit according to claim 1 wherein the potential storing means is a capacitor.

3. A circuit according to claim 1 wherein the potential changing means is a transistor, the collector of which is connected to the potential storing means and the emitter of which is connected to the means for providing a reference potential.

4. A circuit for exercising a control function in response to receipt of an input bias signal of one of two possible magnitudes including:

a capacitor charged to a potential;

means for providing a reference potential of at least one magnitude; and a transistor, having at least base, collector and emitter electrodes, the collector electrode being connected to the capacitor, the emitter electrode being connected to the reference potential so that the application of the input bias signal of the one magnitude to the base of the transistor renders the transistor conductive to charge the capacitor toward the value of the reference potential if the relative values of the reference potential and the capacitor potential forward-bias the transistor and to charge the capacitor toward the potential of the input bias signal through the forward-biased base-collector junction of the transistor if the relative values of the reference potential and the capacitor potential back bias the transistor.

5. A circuit according to claim 4 wherein the magnitude of the capacitor potential is between a predetermined maximum positive potential and a predetermined maximum negative potential and wherein the two possible magnitudes of the input bias signal are greater than said maximum potentials.

6. A circuit according to claim 4 wherein the transistor is an NPN transistor and the one magnitude of said bias signal is a positive potential, the magnitude of which exceeds the maximum positive potential to which the capacitor may be charged.

7. An astable multivibrator including:

an operational amplifier having first and second inputs with a positive feedback path from the output thereof to said first input and with said output varying between predetermined positive and negative states;

a timing capacitor connected to said second input of the amplifier;

means for charging the timing capacitor from the output of the amplifier, which switches from one output state to its other output state whenever a predetermined relationship exists between the input voltage applied to the second input by the capacitor and the input voltage applied to the first input by means of the positive feedback from the output of the amplifier;

normally nonconductive means connected to the capacitor and to the positive feedback path and rendered conductive in response to an external signal for clamping the charge on the capacitor to a first predetermined value, said clamping means operating to rapidly charge the capacitor to said first predetermined value if said capacitor already is charging toward said first predetermined value at the time the clamping means is rendered conductive, and said clamping means operating to rapidly charge said capacitor to a second predetermined value if said capacitor already is charging toward said second predetermined value at the time the clamping means is rendered conductive, so that said predetermined relationship is attained to cause the amplifier to switch states, whereupon the clamping means operates to rapidly charge the capacitor to said first predetermined value; and means for applying external signals to the clamping means.

8. A circuit according to claim 7 wherein the feedback path includes a second operational amplifier connected as a voltage-follower.

9. A multivibrator according to claim 7 wherein the clamping means is a normally nonconductive transistor, the collector-emitter path of which is connected between the feedback path and said second input of the amplifier.

10. A multivibrator according to claim 9 wherein the external signals bias the transistor into conduction, provided the transistor is forward-biased by the voltages obtained from the feedback path and the capacitor so that the capacitor rapidly is charged to said first predetermined value at which it is clamped so long as the transistor remains biased into conduction, said transistor base-collector junction being forward-biased by said biasing means when the transistor is reversed-biased by the voltages obtained from the feedback path and the capacitor so that the capacitor rapidly is charged through the base-collector junction of the transistor to said second predetermined value sufficient to cause the operational amplifier output to switch from one output state to the other, whereupon the collector-emitter junction of the transistor substantially immediately becomes forward-biased, permitting the capacitor to discharge to said first predetermined value through the collector-emitter junction of the transistor.